(12) United States Patent
Lambourn et al.

(10) Patent No.: US 10,444,457 B2
(45) Date of Patent: Oct. 15, 2019

(54) MANAGED CONNECTIVITY IN OPTICAL DISTRIBUTION FRAME

(71) Applicants: COMMSCOPE CONNECTIVITY UK LIMITED, Dorcan, Swindon (GB); COMMSCOPE TELECOMMUNICATIONS (SHANGHAI) CO. LTD., Shanghai (CN)

(72) Inventors: Stephen Lambourn, Swindon (GB); Ian Miles Standsih, Flintshire (GB); Alan Cook, Liverpool (GB); David Mather, Altrincham (GB); Lee Holloway, Flintshire (GB); Junkai Wang, Shanghai (CN)

(73) Assignees: COMMSCOPE CONNECTIVITY UK LIMITED (GB); COMMSCOPE TELECOMMUNICATIONS (SHANGHAI) CO. LTD. (CN)

( * ) Notice: Subject to any disclaimer, the term of this patent is extended or adjusted under 35 U.S.C. 154(b) by 114 days.

(21) Appl. No.: 15/118,920

(22) PCT Filed: Feb. 14, 2014

(86) PCT No.: PCT/CN2014/072099
§ 371 (c)(1),
(2) Date: Aug. 15, 2016

(87) PCT Pub. No.: WO2015/120617
PCT Pub. Date: Aug. 20, 2015

(65) Prior Publication Data
US 2016/0370552 A1 Dec. 22, 2016

(51) Int. Cl.
*G02B 6/44* (2006.01)
*G02B 6/38* (2006.01)
(Continued)

(52) U.S. Cl.
CPC ......... *G02B 6/4455* (2013.01); *G02B 6/3897* (2013.01); *G02B 6/4448* (2013.01);
(Continued)

(58) Field of Classification Search
CPC .............. G02B 6/4452–6/4455; H05K 7/1424
(Continued)

(56) References Cited

U.S. PATENT DOCUMENTS

| 4,975,068 A | 12/1990 | Squires |
| 6,510,056 B1 | 1/2003 | Kusyk et al. |

(Continued)

FOREIGN PATENT DOCUMENTS

| CN | 1338138 A | 2/2002 |
| CN | 201344983 Y | 11/2009 |

(Continued)

OTHER PUBLICATIONS

International Search Report for International Application No. PCT/CN2014/072099 dated Nov. 21, 2014 (4 pages).

(Continued)

*Primary Examiner* — Tuan T Dinh
(74) *Attorney, Agent, or Firm* — Merchant & Gould P.C.

(57) ABSTRACT

A connection assembly (100) includes a base structure (110); a backplane (120) coupled to the base structure (110), the backplane (120) including a first circuit board (122); and a tray module (140) configured to couple to the backplane (120). The tray module (140) includes a tray body (160) including a second circuit board (162); and a bridge member (150) to which the tray body (160) is moveably coupled. The tray body (160) moves relative to the backplane (120) while the bridge member (150) remains stationary relative to the backplane (120). Managed connectivity components (250) on the second circuit board (162) remain connected to the (Continued)

first circuit board (122) even while the tray body (160) is pivoting relative to the backplane (120).

23 Claims, 15 Drawing Sheets

(51) Int. Cl.
*H05K 1/11* (2006.01)
*H05K 1/14* (2006.01)
*H05K 3/36* (2006.01)
*H05K 5/00* (2006.01)

(52) U.S. Cl.
CPC .......... *G02B 6/4452* (2013.01); *H05K 1/117* (2013.01); *H05K 1/147* (2013.01); *H05K 1/148* (2013.01); *H05K 3/363* (2013.01); *H05K 5/0026* (2013.01)

(58) Field of Classification Search
USPC .................. 361/788, 796–802; 385/134–135
See application file for complete search history.

(56) References Cited

U.S. PATENT DOCUMENTS

| | | | | |
|---|---|---|---|---|
| 7,110,654 | B2 * | 9/2006 | Dillat | G02B 6/4455 385/135 |
| 7,147,484 | B1 * | 12/2006 | Kobayashi | G06F 1/1616 361/679.26 |
| 7,418,182 | B2 * | 8/2008 | Krampotich | G02B 6/4455 385/134 |
| 2006/0274515 | A1 * | 12/2006 | Arthur | H05K 7/1424 361/796 |
| 2007/0047894 | A1 * | 3/2007 | Holmberg | G02B 6/4452 385/135 |
| 2009/0148117 | A1 * | 6/2009 | Laurisch | G02B 6/4455 385/135 |
| 2012/0113613 | A1 | 5/2012 | Anderson et al. | |
| 2013/0205579 | A1 | 8/2013 | Mather et al. | |

FOREIGN PATENT DOCUMENTS

| | | |
|---|---|---|
| CN | 102331608 A | 1/2012 |
| CN | 102419467 A | 4/2012 |
| CN | 202305931 U | 7/2012 |
| CN | 202383332 U | 8/2012 |
| CN | 103064160 A | 4/2013 |

OTHER PUBLICATIONS

Extended European Search Report for European Patent Application No. 14882630.8 dated Nov. 15, 2017, 10 pages.

* cited by examiner

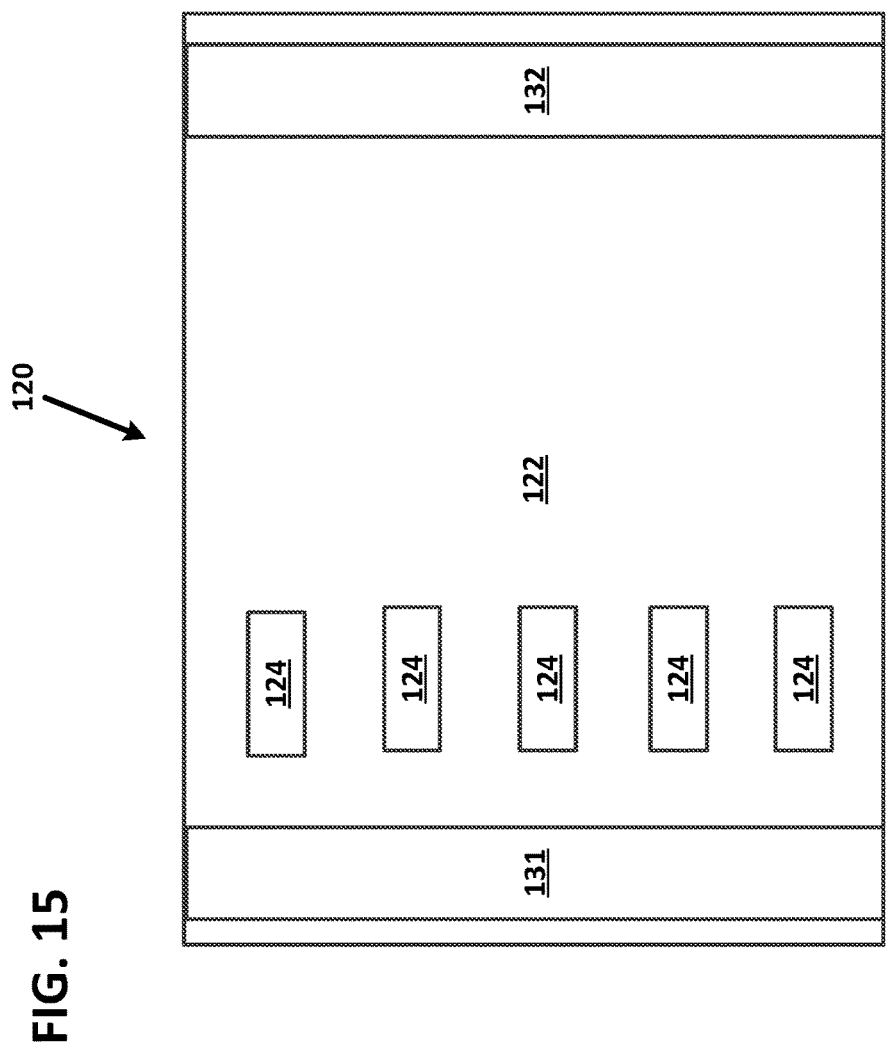

MANAGED CONNECTIVITY IN OPTICAL DISTRIBUTION FRAME

This application is a National Stage Application of PCT/CN2014/072099, filed 14 Feb. 2014, and which application is incorporated herein by reference. To the extent appropriate, a claim of priority is made to the above disclosed applications.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in a limited space.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

Some aspects of the disclosure are directed to an example connection assembly including a base structure; a backplane coupled to the base structure; and a tray module configured to couple to the backplane. The backplane includes a first circuit board. The tray module includes a tray body and a bridge member to which the tray body is moveably coupled so that the tray body is moveable relative to the backplane when the tray module is coupled to the backplane. The tray body includes a second circuit board and an optical adapter. The bridge member is configured to couple to the backplane in a fixed orientation so that the bridge member does not pivot relative to the backplane. The bridge member provides a secure electrical connection between the second circuit board and the first circuit board even while the tray body is moving relative to the backplane.

The bridge member facilitates physically and electrically connecting the tray body to the backplane. The bridge member also enables the tray body to move relative to the backplane while enabling the circuit board of the tray body to remain securely connected to the backplane.

In certain implementations, the tray body is configured to pivot relative to the bridge member. In an example, the tray body pivots relative to the bridge member about a hinge pin. In certain implementations, the tray body is configured to pivot at least about 45° relative to the backplane. In certain implementations, the tray body is configured to pivot at least about 60° relative to the backplane. In an example, the tray body is configured to pivot at least about 62° relative to the backplane.

In certain implementations, a connector is electrically connected to the second circuit board. The connector is configured to mate with the first circuit board (e.g., with contacts pads disposed thereon, with a corresponding connector thereat, etc.) to electrically connect the second circuit board to the first circuit board. In an example, the connector is disposed on the bridge member.

In certain implementations, a first end of a flexible circuit arrangement is coupled to the second circuit board and a second end of the flexible circuit is terminated by the connector. The flexible circuit arrangement enables movement of the second circuit board relative to the first circuit board while maintaining a connection between the first and second circuit boards.

In certain implementations, the bridge member includes a latch pin arrangement that fits with a mounting arrangement disposed on the backplane when the tray module is coupled to the backplane. In examples, each bridge member includes two latch pin arrangements disposed at opposite sides of the bridge member. In an example, each latch pin arrangement includes a pair of latch pins and the mounting arrangement defines a snap-fit region at which one of the latch pins of each pair fits and a guide region along which the other of the latch pins of each pair travels to align the bridge arrangement with the backplane.

In certain implementations, the mounting arrangement includes a hook area configured to capture the latch pin arrangement if the tray module is accidentally disconnected from the backplane.

Other aspects of the disclosure are directed to an example method of accessing a tray at a connection assembly while monitoring PLI at the connection assembly. The method includes accessing a selected tray including pivoting at least one tray without disconnecting the respective second circuit boards from the first circuit board. The trays are pivoted relative to the respective bridge members while the bridge members remain stationary relative to the backplane. The method also includes monitoring PLI associated with optical connectors disposed at the trays by reading the PLI using associated media reading interfaces.

In certain implementations, the PLI of the optical connectors of at least one tray is monitored while the tray is being pivoted.

In certain implementations, optical fiber connectors can be plugged into ports of the optical adapters of the accessed tray. PLI of the optical fiber connectors can be monitored using media reading interfaces when the optical fiber connectors are plugged into the ports.

In certain implementations, the selected tray can be removed from the backplane by pulling the respective bridge member away from a mounting arrangement at the backplane. Removing the bridge member from the mounting arrangement disconnects the respective second circuit board from the first circuit board at the backplane.

Other aspects of the disclosure are directed to an example tray module including a tray body on which a circuit board and a plurality of optical adapters are disposed; a bridge member configured to couple to the tray body so that the tray body is pivotable relative to the bridge member; and a flex circuit arrangement. The circuit board includes media reading interfaces disposed at ports of the optical adapters. The bridge member includes an electrical connector. A first end of the flex circuit is connected to the media reading interfaces via the circuit board. A second end of the flex circuit is terminated by the electrical connector. The flex circuit is sufficiently flexible to enable pivotal movement of at least about 45° between the tray body and the bridge member.

In some implementations, an adapter holder arrangement is disposed on the tray body. The adapter holder arrangement includes a plurality of latching arms configured to hold at least one optical adapter to the tray body.

In certain implementations, the latching arms of the adapter holder arrangement are positioned in rows. One of the latching arms in each row faces in a first direction and another of the latching arms in each row faces in a second, opposite direction. The latching arms of adjacent rows cooperate to hold one of the optical adapters to the tray body.

In certain implementations, the adapter holder arrangement includes a plurality of latching members. Each latching member includes one of the latching arms. Each latching member also includes a support arm. In an example, the adapter holder arrangement includes the latching members arranged in rows of two latching members. The latching arm of a first of the two latching members faces in a first direction and the latching arm of a second of the two latching members faces in a second, opposite direction. In an example, the support arms of the two latching members are positioned adjacent each other so that the support arms of adjacent rows are configured to hold flanges on respective optical adapters mounted between the adjacent rows.

Other aspects of the disclosure are directed to an example connection assembly including a base structure; a backplane coupled to the base structure; and a mounting arrangement coupled to the backplane. The backplane includes a first circuit board. In certain examples, the first circuit board defines contact pads. The mounting arrangement has snap-fit regions defining pairs of slots and guide regions including guide surfaces. Each guide surface is associated with one of the pairs of slots.

In certain implementations, the mounting arrangement includes a first mounting member and a second mounting member that is spaced from the first mounting member. The first and second mounting members define aligned snap-fit regions and aligned guide regions.

In certain implementations, the mounting arrangement also includes a plurality of lip members extending upwardly from the guide surfaces to define hook areas.

In certain implementations, the backplane is pivotally mounted to the base structure.

Non-limiting examples of a base structure include a chassis, a drawer, a tray, a rack, a cabinet or other enclosure, or a frame.

Other aspects of the disclosure are directed to an example method of assembling a connection system. The method includes assembling a tray module by pivotally mounting a tray body to a bridge member; connecting a first end of a flex circuit to a circuit board of the tray body and connecting a second end of the flex circuit to the bridge member; latching the bridge member to a backplane of the connection system so that the bridge member is disposed at a fixed orientation relative to the backplane; and plugging a circuit board connector of the bridge member into a corresponding circuit board connector of the backplane. The circuit board connector terminates the second end of the flex circuit. The tray body is configured to pivot relative to the backplane without disconnecting the circuit board from the backplane.

In certain implementations, latching the bridge member to the backplane includes snapping latch pin arrangements at opposite sides of the bridge member into slots defined in a mounting arrangement disposed on the backplane.

In certain implementations, plugging the circuit board connector of the bridge member into the corresponding circuit board connector of the backplane is implemented automatically as a result of latching the bridge member to the backplane.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows:

FIG. 15 is a schematic view of a backplane of the connection assembly of FIG. 3 in which the contact pads are shown.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
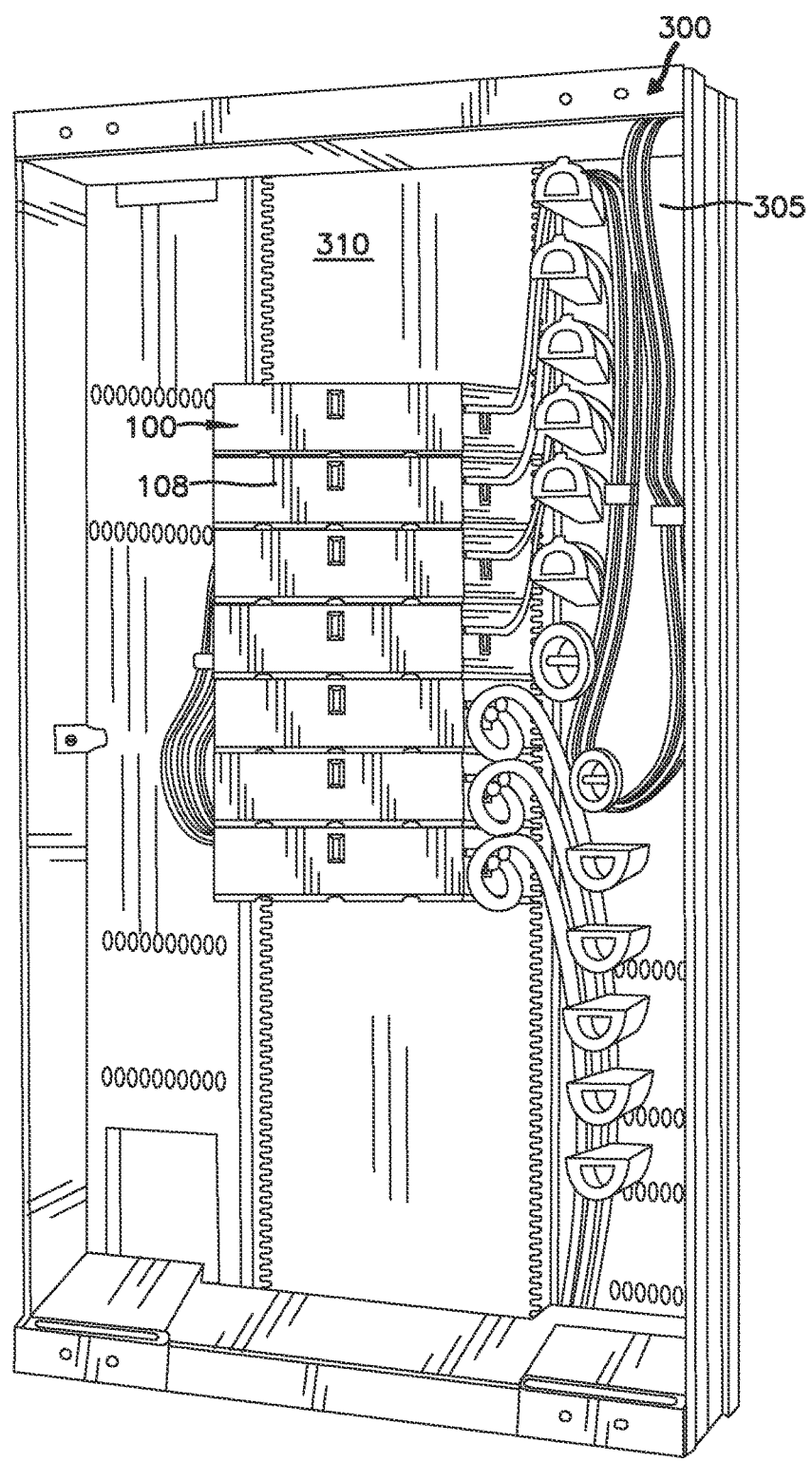
FIG. 1 illustrates one example optical distribution frame in which one or more connection assemblies can be mounted in accordance with principles of the present disclosure.

FIG. 1 illustrates one example optical distribution frame 300 in which one or more connection assemblies 100 can be mounted. The frame 300 includes one or more racks at each of which one or more connection assemblies 100 can be mounted. For example, seven connection assemblies 100 are shown mounted to a rack 310 in the frame 300 shown in FIG. 1. In other implementations, however, the frame 300 may include a greater number of racks 310 and each rack 310 may include a greater or lesser number of connection assemblies 100.

Figure 2:
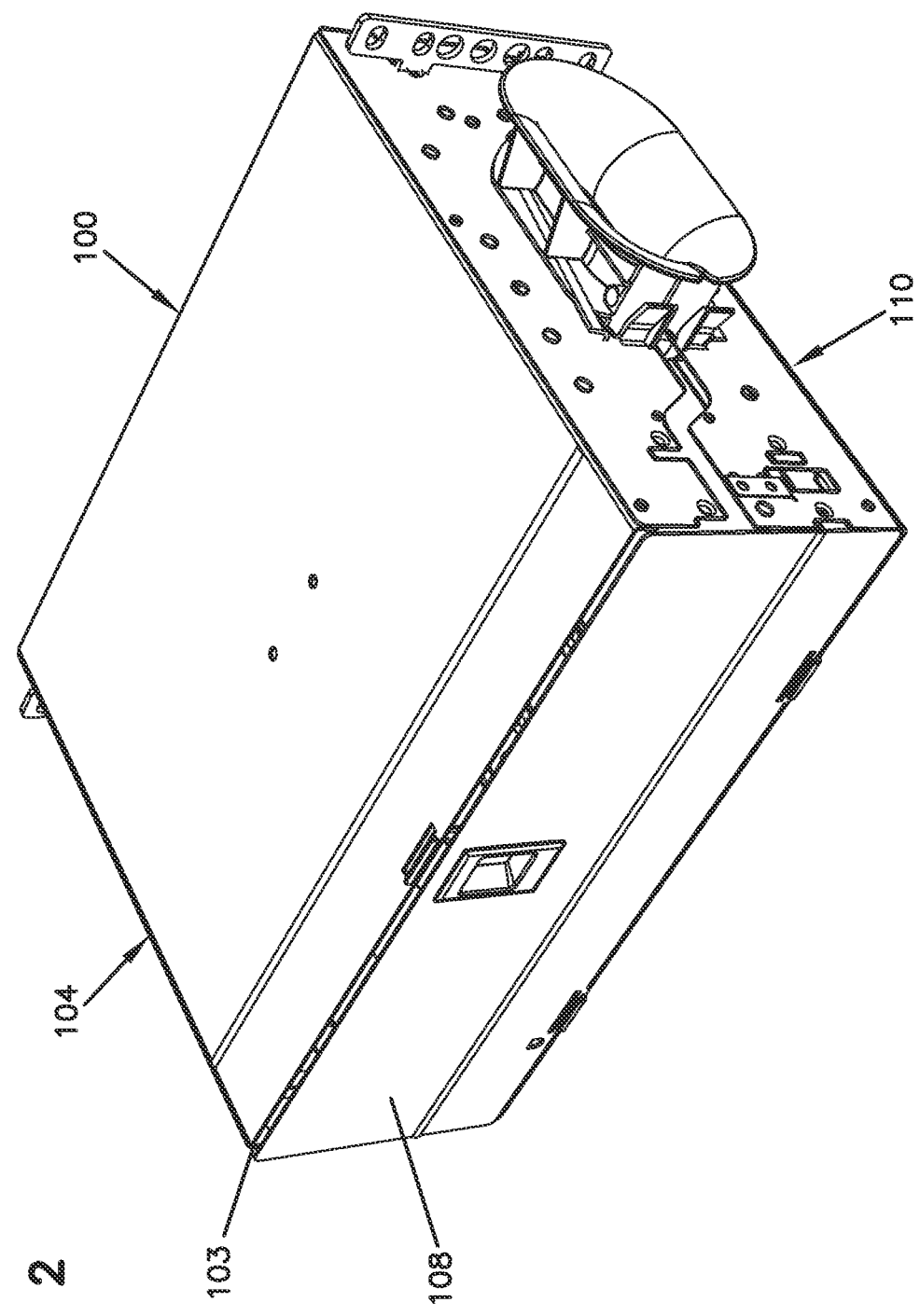
FIG. 2 is a front perspective view of an example connection assembly suitable for mounting in the rack of FIG. 1 in accordance with principles of the present disclosure.

FIG. 2 is a perspective view of one example connection assembly 100 that is configured to mount to a frame 300. In the example shown, the connection assembly 100 includes a general patch splice tray or "GPST". In other implementations, other types of connection assemblies can be utilized. In various implementations, connection assemblies enable optical connections (e.g., via optical splices, optical adapters, etc.), store excess optical fiber, and/or manage optical fiber.

Figure 3:
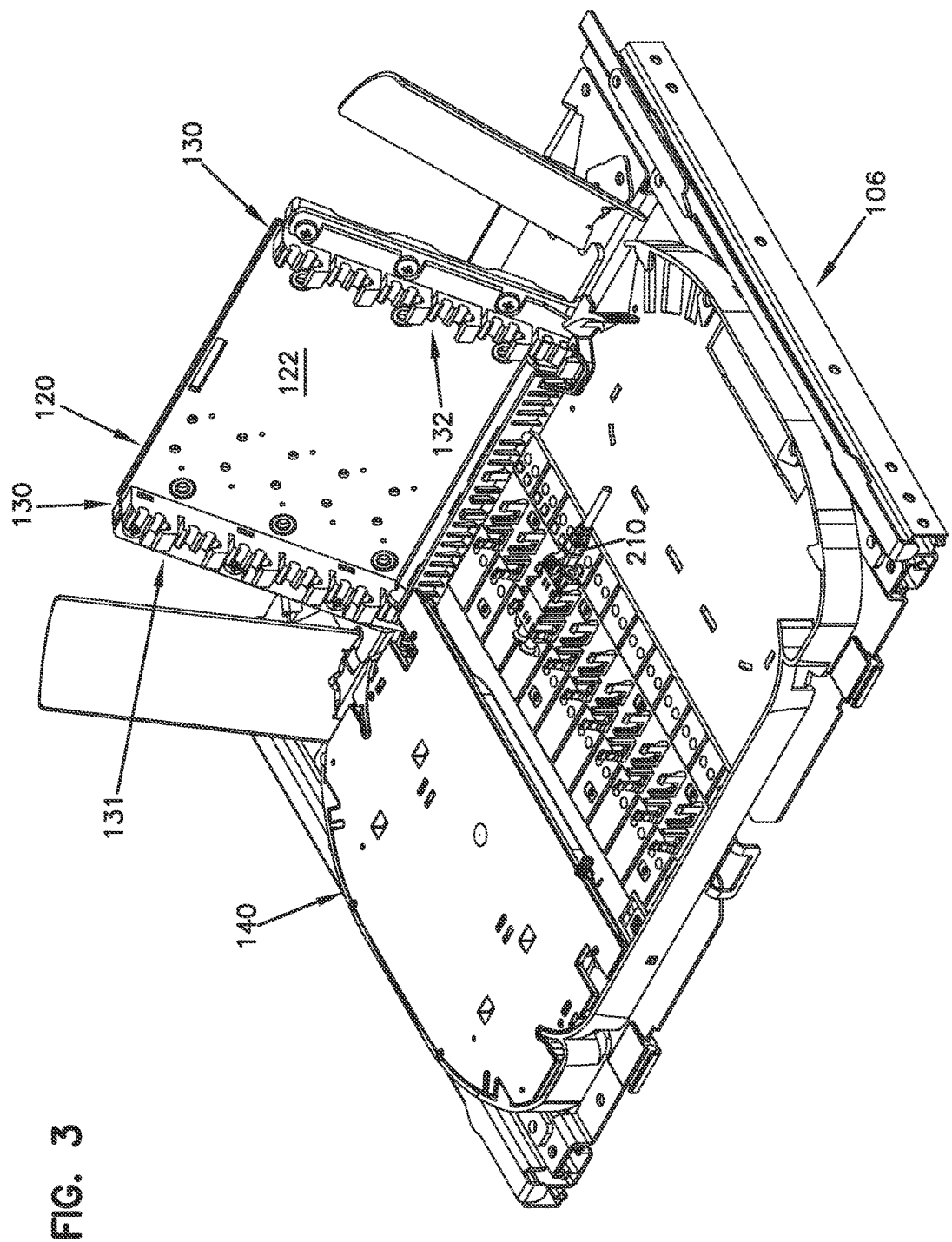
FIG. 3 is a front perspective view of the connection assembly of FIG. 2 with portions of an enclosure removed for improved visibility of interior components in accordance with principles of the present disclosure.

Each connection assembly 100 includes a base structure 110 in which communication components can be housed. In some implementations, the base structure 110 includes an enclosure 104 (FIG. 2) and a shelf 106 (FIG. 3). The shelf 106 is configured to slide in and out of an open front 103 of the enclosure 104. A front panel 108 (FIG. 2) is attached to the front of the shelf 106 so that when the shelf 106 has been completely pushed into the enclosure 104, the front panel 108 can be flipped up to close the front opening 103 of the enclosure 104. Also, the front panel 108 can be flipped down to allow the shelf 106 to slide out of the enclosure 104.

As shown in FIGS. 2 and 3, a backplane 120 is coupled to the base structure 110. For example, the backplane 120 can be mounted to the shelf 106. The backplane 120 is configured to receive one or more tray modules 140 that each hold communications components (e.g., optical adapters, optical splitters, optical storage members (e.g., spools, bend radius limiters, etc.). In certain implementations, the backplane 120 is configured to mechanically support the tray modules 140. In certain implementations, the backplane 120 is configured to releasably receive the tray modules 140.

One or more managed connectivity components can be disposed on the tray modules 140. The managed connectivity components store and communicate physical layer information ("PLI") about components of the connection assembly 100 and/or optical media connected thereto. As will be discussed herein, the backplane 120 connects the managed connectivity components of each tray module 140 to a data management network at which the PLI can be aggregated, stored, analyzed, and/or distributed. An example of a data management network can be found in U.S. Publication No. 2011/0262077, the disclosure of which is hereby incorporated herein by reference. Another example of a data management network can be found in U.S. Ser. No. 13/939,830, filed on Jul. 11, 2013, and titled "RFID-Enabled Optical Adapter for Use with a Patch Panel," the disclosure of which is hereby incorporated herein by reference.

A first circuit board 122 is disposed at the backplane 120. In some implementations, a base circuit board 105 is mounted to the base structure 110 and is configured to be connected to the data management network. In certain implementations, the first circuit board 122 electrically couples to the base circuit board 105 (e.g., via a flexible circuit arrangement 129). In certain implementations, the base circuit board 105 is mounted to the shelf 106 to move relative to the enclosure 104. In other implementations, the base circuit board 105 is mounted to the enclosure 104 and the shelf 106 moves relative to the base circuit board 105. In other implementations, the first circuit board 122 can include a network port at which a data management network cable routed to the enclosure 104 can be received.

Figure 6:
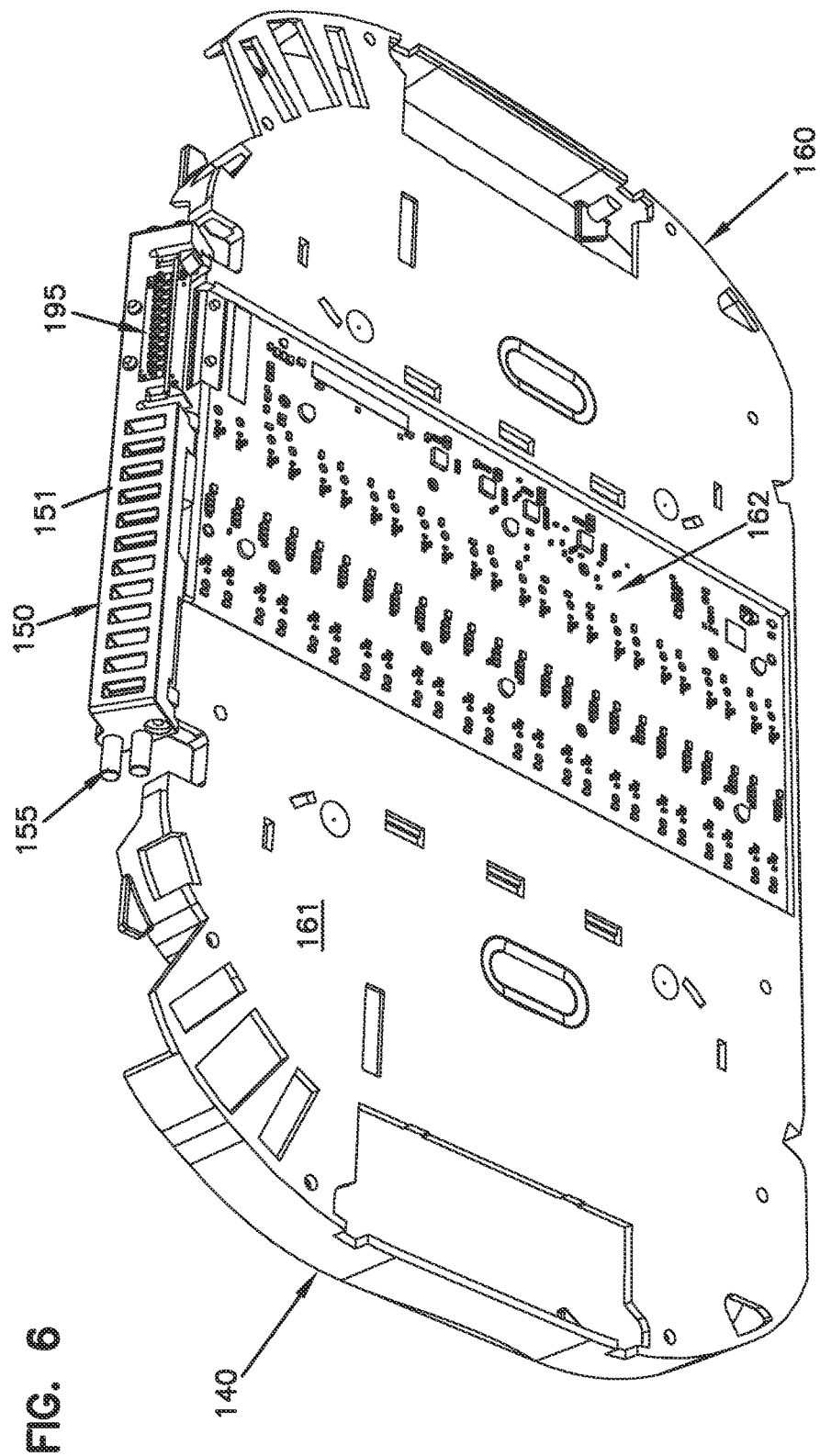
FIG. 6 is a bottom perspective view of the tray module of FIG. 5.

Second circuit boards 162 are disposed at the tray modules 140 (e.g., see FIG. 6). The managed connectivity components are mounted or otherwise connected to the second circuit boards 162 as will be described in more detail herein. The tray modules 140 are configured to electrically connect each of the second circuit boards 162 to the first circuit board 122. For example, each tray module 140 can include a flexible circuit arrangement 190 (FIG. 7) that enables a connection between a respective one of the second circuit boards 162 and the first circuit board 122.

The flexible circuit arrangement 190 extends between and electrically connects the second circuit board 162 and an electrical connector 195 (e.g., a circuit board connector) disposed on the tray module 140. The electrical connector 195 is configured to connect to the first circuit board 122. For example, in some implementations, the electrical connector 195 may include contact members that are configured to touch contact pads 124 disposed at the first circuit board 122 (FIG. 15) when the tray module 140 is received at the backplane 120. In other implementations, the electrical connector 195 may be configured to mate with a corresponding connector disposed at the first circuit board 122. Accordingly, the managed connectivity components of each tray module 140 connect to the data management network via the respective flexible circuit arrangement 190, the first circuit board 122, and the flexible circuit arrangement 129 as will be disclosed in more detail herein.

Figure 7:
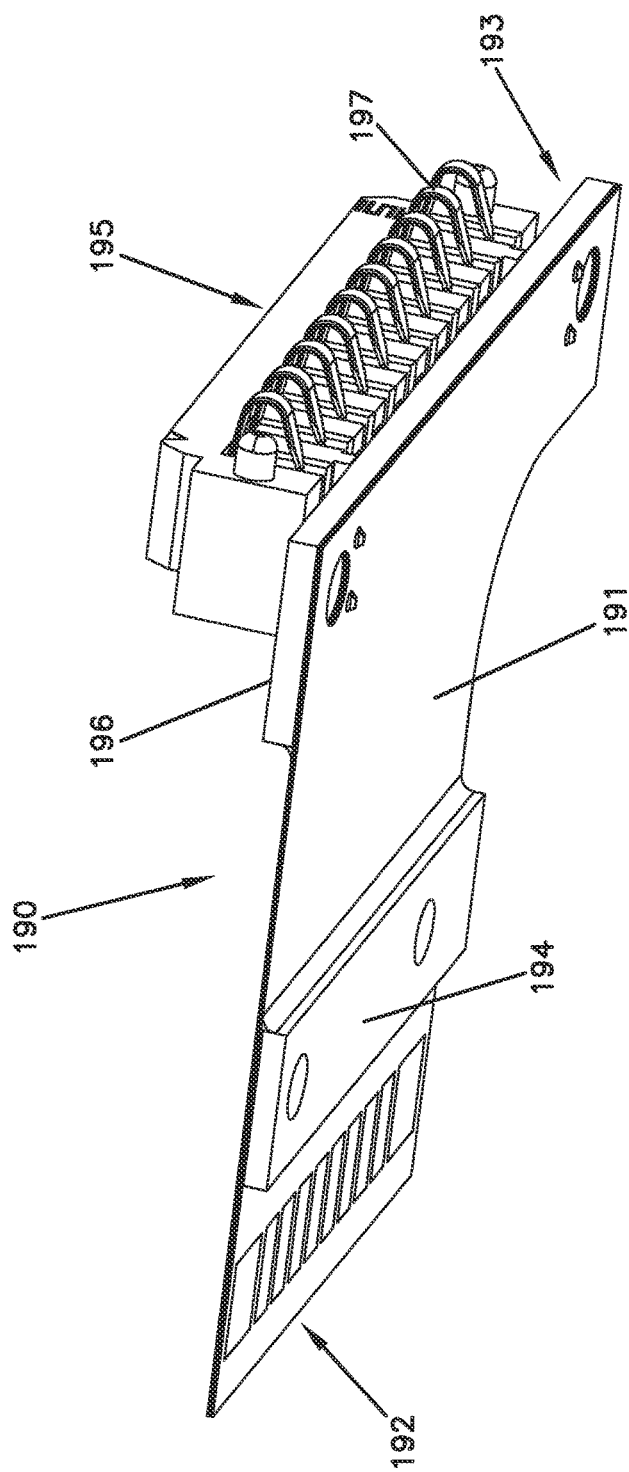
FIG. 7 is a perspective view of an example flexible circuit arrangement suitable for use with the tray module of FIG. 5.

FIG. 7 illustrates one example flexible circuit arrangement 190 suitable for mounting to the tray module 140. The flexible circuit arrangement 190 includes a flexible board or base 191 that extends between a first end 192 and a second end 193. The first end 192 is configured to couple to the second circuit board 162 and the second end 193 is terminated by the electrical connector 195. In certain examples, the first end 192 is soldered (e.g., hot shoe soldered) or otherwise connected to the second circuit board 162. In certain implementations, the electrical connector 195 is coupled to a rigid section 196 of the flexible board 191. The electrical connector 195 includes outwardly protruding contact members 197. In an example, the flexible circuit arrangement 190 also includes a strain bar 194 that is hot stamped or otherwise connected to the tray body 160.

The flexible circuit arrangement 190 enables movement between the second circuit board 162 and the electrical connector 195 as will be disclosed in more detail herein. In some implementations, each tray module 140 is configured to enable movement between the respective second circuit board 162 and the electrical connector 195. Accordingly, the tray module 140 and the flexible circuit arrangement 190 enable movement between the respective second circuit board 162 and the first circuit board 122. For example, each tray module 140 and respective flexible circuit arrangement 190 can be configured to enable rotational movement between the respective second circuit board 162 and the first circuit board 122.

The tray modules 140 are configured to couple to the backplane 120 via a mounting arrangement 130 disposed on the backplane 120 (see FIG. 3). In certain implementations, the tray modules 140 are removably attached to the backplane 120 via the mounting arrangement 130. For example, removing a tray module 140 may assist in providing access to that tray module 140 or to tray modules 140 that are underneath it. In another example, a damaged tray module 140 can be replaced with a new tray module 140. In addition, tray modules 140 can be subsequently added, thereby enabling a user to incrementally add capacity to the system. The tray module 140 also can be easily re-mounted to the backplane 120 via the mounting arrangement 130.

In certain implementations, the mounting arrangement 130 is configured to automatically connect the respective electrical connector 195 of a tray module 140 to the first circuit board 122 at the backplane 120 when the tray module 140 is secured at the mounting arrangement 130. For example, the electrical connector 195 can be fixedly coupled to the tray module 140 so that aligning the tray module 140 with the mounting arrangement 130 also aligns the electrical connector 195 with the corresponding contact pads on the first circuit board 122. The mounting arrangement 130 may be further configured so that movement to secure (e.g., latch, snap-over, friction fit, etc.) the tray module 140 to the mounting arrangement 130 also causes the contact members of the electrical connector 195 to touch the contact pads (or causes the electrical connector 195 to mate with a corresponding connector on the first circuit board 122).

In some implementations, the mounting arrangement 130 enables the tray modules 140 to be mounted to the backplane 120 in a stacked configuration. An edge of each tray module 140 connects to the mounting arrangement 130 so that an access side of the tray module 140 faces away from the shelf 106. Each tray module 140 is pivotally mounted to the backplane 120 so that the tray module 140 can be flipped up in order to provide access to the access side of the tray module 140 that is underneath it (if there is one). In an example, the backplane 120 can extend upwardly from the shelf 106 at a non-orthogonal angle. In such an example, the tray modules 140 are arranged in a stair step configuration. In other implementations, however, the backplane 120 can be oriented perpendicular to the shelf 106.

Figure 5:
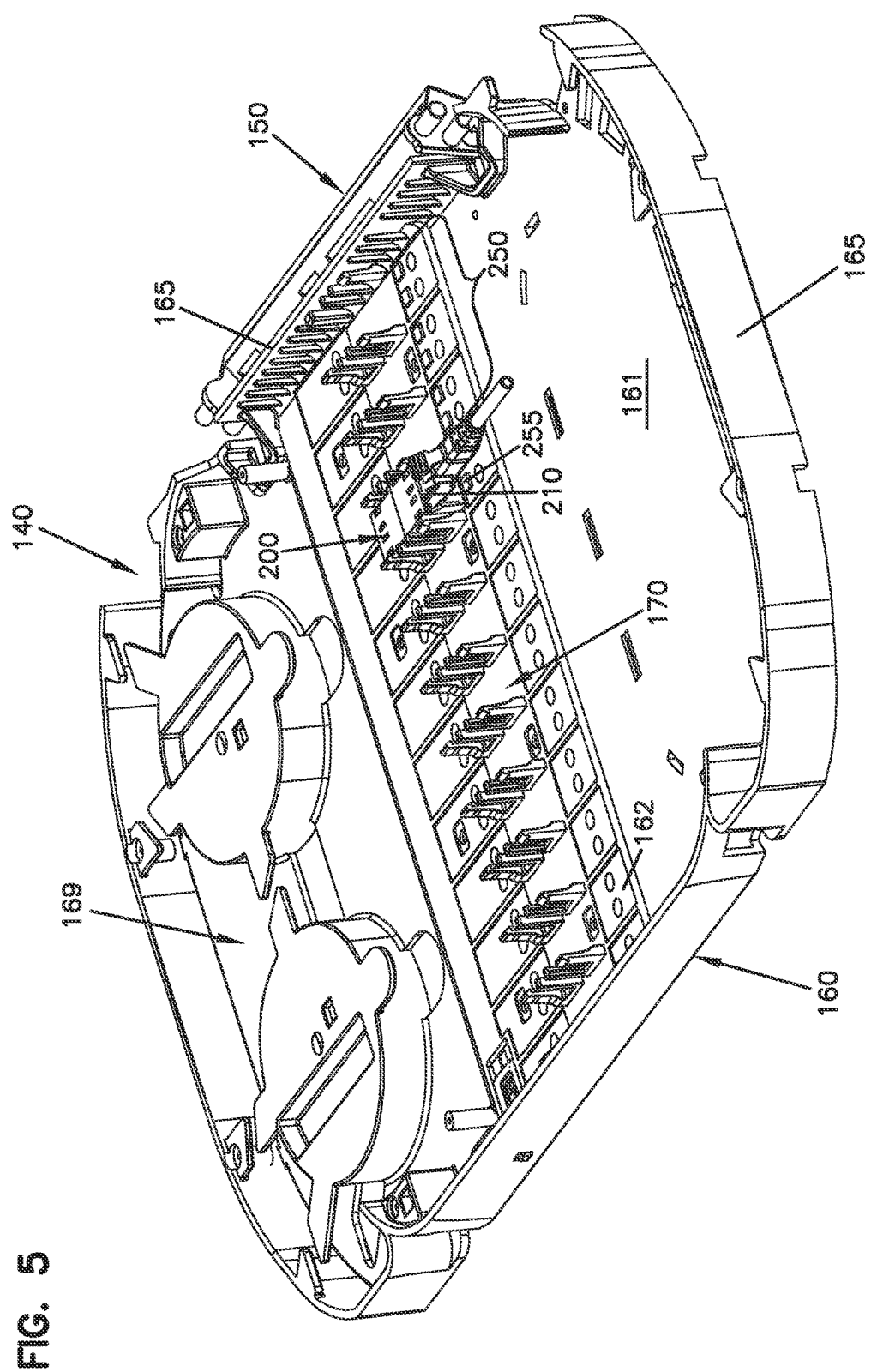
FIG. 5 is a top perspective view of an example tray module suitable for use with the connection assembly of FIG. 2, the tray module including a tray body disposed in a first position relative to a bridge member in accordance with principles of the present disclosure.
Figure 9:
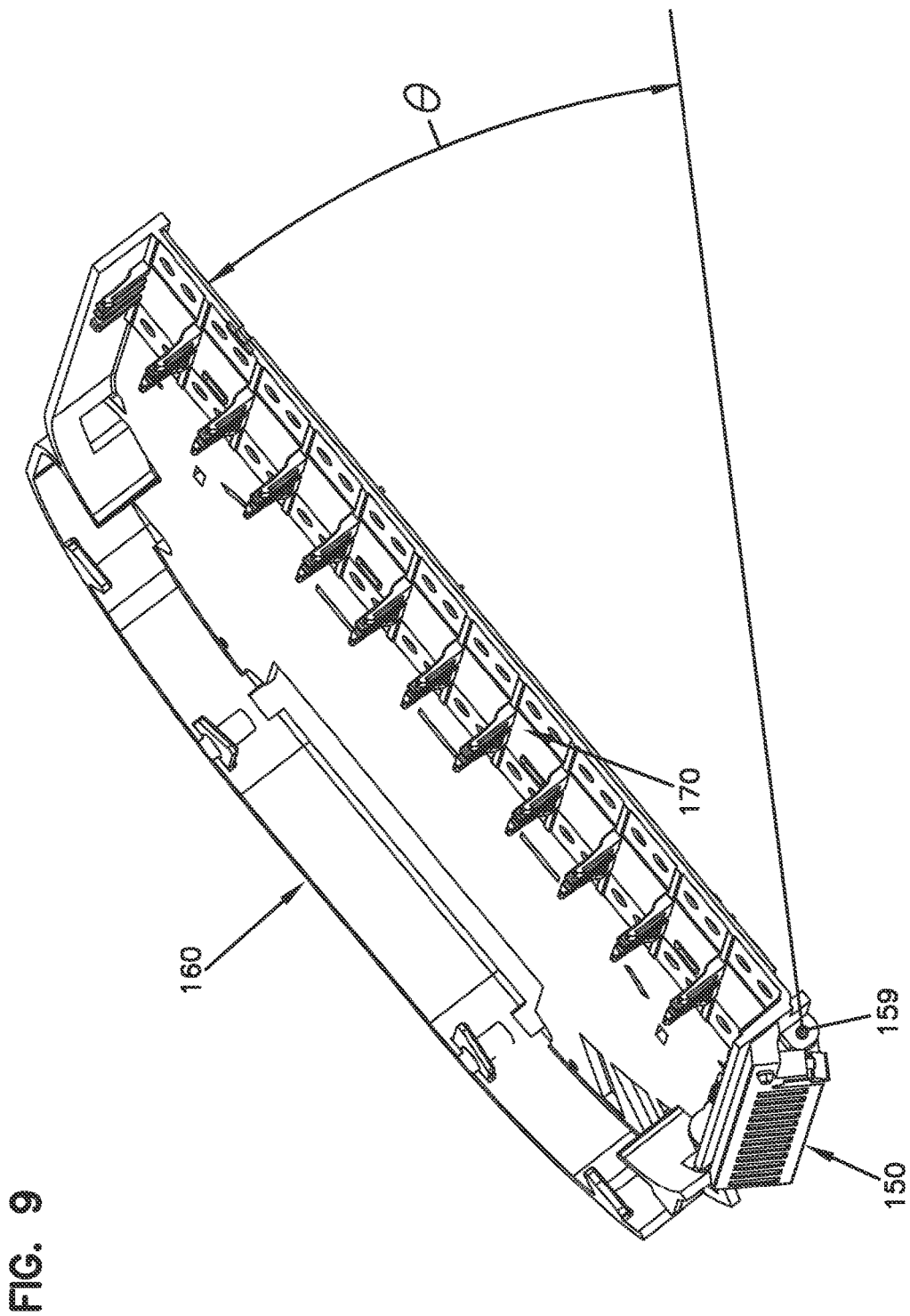
FIG. 9 is a cross-sectional view of the example tray module of FIG. 5 with the tray body disposed in a second position relative to the bridge member in accordance with principles of the present disclosure.

FIGS. 5 and 6 illustrate one example tray module 140 suitable for mounting to a backplane 120. The example tray module 140 includes a bridge member 150 and a tray body 160 that couples to the bridge member 150. The tray module 140 is configured to enable the tray body 160 to move (e.g., pivot) relative to the bridge member 150. The tray body 160 can move along an angle θ (FIG. 9) relative to the bridge member 150 between a first position (see FIG. 5) and a second position (FIG. 9). In some implementations, the angle θ is at least about 30°. In certain implementations, the angle θ is at least about 45°. In some implementations, the angle θ is at least about 60°. In an example, the angle θ is about 62°. In another example, the angle θ is about 62.5°.

Figure 8:
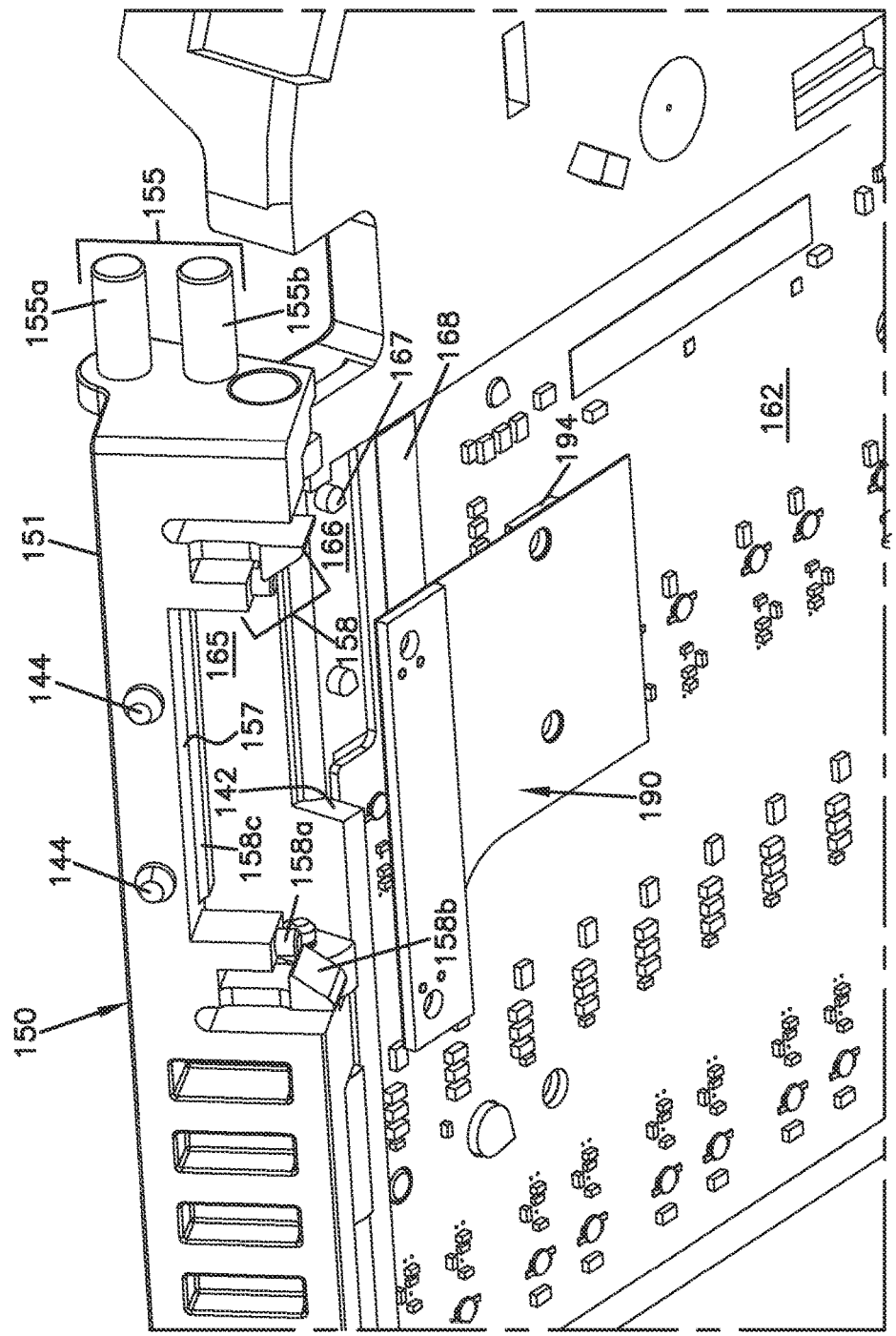
FIG. 8 is an enlarged view of the tray module of FIG. 6 with the flexible circuit arrangement of FIG. 7 exploded outwardly from the tray module.

As shown in FIG. 8, the tray module 140 is configured to hold the circuit board connector 195 and to accommodate movement between the circuit board connector 195 and the tray body 160. For example, the bridge member 150 is configured to hold the electrical connector 195 and the tray body 160 is configured to hold the first end 192 of the flexible circuit board arrangement 190. Alignment pins 144 facilitate mounting the tray module 140 to the backplane 120 as will be described in more detail herein.

The bridge member 150 includes a body 151 defining a slot or opening 157 at which the electrical connector 195 is disposed. The bridge member 150 also includes mounting structures 158 for securing the electrical connector 195 to the body 151. In certain implementations, the mounting structures 158 include one or more alignment pegs 158a, one or more latch arms 158b, one or more ribs 158c, and/or other fastening members. In the example shown, alignment pegs 158a extend into openings defined in the rigid section 196 of the flexible board 191, latch arms 158b snap-over the rigid section 196, and a rib 158c inhibits movement of the connector 195 towards the circuit board 162. The alignment pegs 158a, latch arms 158b, and rib 158c cooperate to hold the electrical connector 195 at a fixed position relative to the bridge member 150.

The second circuit board 162 defines a contact pad region 168 at which the second end 193 of the flexible circuit board arrangement 190 is secured to the second circuit board 162. For example, the second end 193 can be hot-shoe soldered to the second circuit board 162. The second circuit board 162 also defines a recess or notch 166 at which a strain bar 194 of the flexible circuit board arrangement 190 can be secured to the tray body 161. In certain implementations, pins 167 are disposed at the recess 166 to fit with holes defined at the strain bar 194. In an example, the strain bar 194 can be hot stamped into place with the pins 167.

Figure 10:
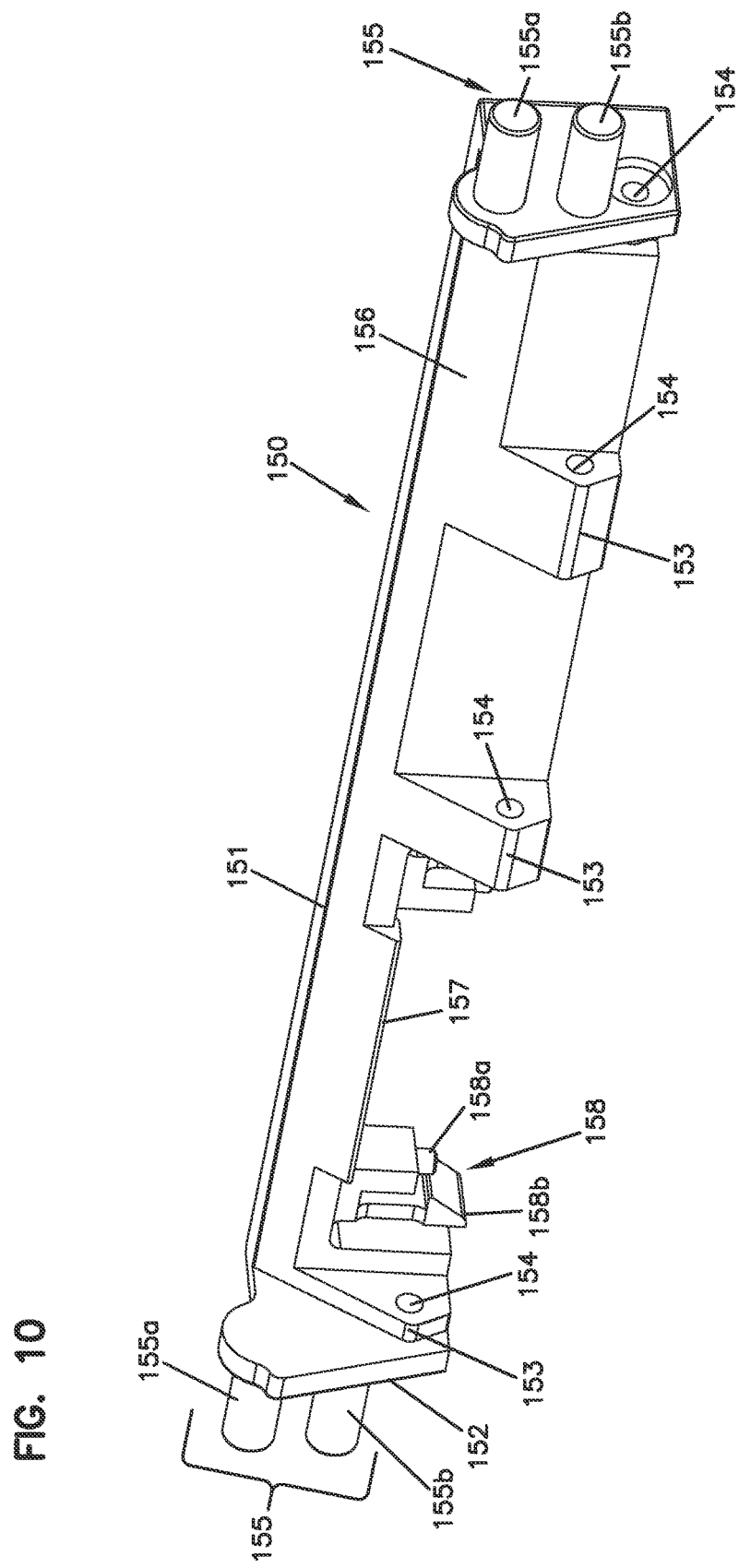
FIG. 10 is a perspective view of an example bridge member suitable for use with the tray module of FIG. 6 in accordance with principles of the present disclosure.

FIG. 10 is a perspective view of an example bridge member 150 suitable for use in the tray module 140 of FIGS. 6-9. The bridge member body 151 is configured to couple to the backplane 120 (e.g., via the mounting arrangement 130) in a fixed orientation so that the bridge member 150 does not pivot relative to the backplane 120 as will be disclosed in more detail herein. The bridge member 150 also is configured to provide a secure electrical connection between the second circuit board 162 of the tray module 140 and the first circuit board 122 of the backplane 120 even while the tray body 160 is moved relative to the backplane 120 as will be disclosed in more detail herein.

The bridge member body 151 is elongated between opposite ends 152. The body 151 defines one or more bores 154 defining a pivot axis that extends between the opposite ends 152. In some implementations, the bridge member body 151 includes one or more support members 153 with each support member 153 defining one of the bores 154. In certain implementations, multiple support members 153 are spaced along the body 151 so that the bores 154 align to form the pivot axis for the tray body 160.

In some implementations, the bridge member 150 includes at least one latch pin arrangement 155 that is configured to attach to the mounting arrangement 130 at the backplane 120. Each latch pin arrangement 155 includes at least one latch pin 155a extending outwardly from the bridge member body 151. In an example, each latch pin 155a extends outwardly generally parallel to the pivot axis. In certain implementations, each latch pin arrangement 155 includes a pair of latch pins 155a, 155b.

In certain implementations, the bridge member body 151 includes a latch pin arrangement 155 at each end 152 of the bridge member 150. In such implementations, the mounting arrangement 130 includes a first mounting member 131 spaced along the backplane 120 from a second mounting member 132 (e.g., see FIG. 3). The latch pin arrangement 155 at the first end of the bridge member body 151 is received at the first mounting member 131 and the latch pin arrangement 155 at the second end of the bridge member body 151 is received at the second mounting member 132. In certain implementations, each mounting member 131, 132 is configured to receive the latch pin arrangement 155 of multiple bridge members 150.

Figure 11:
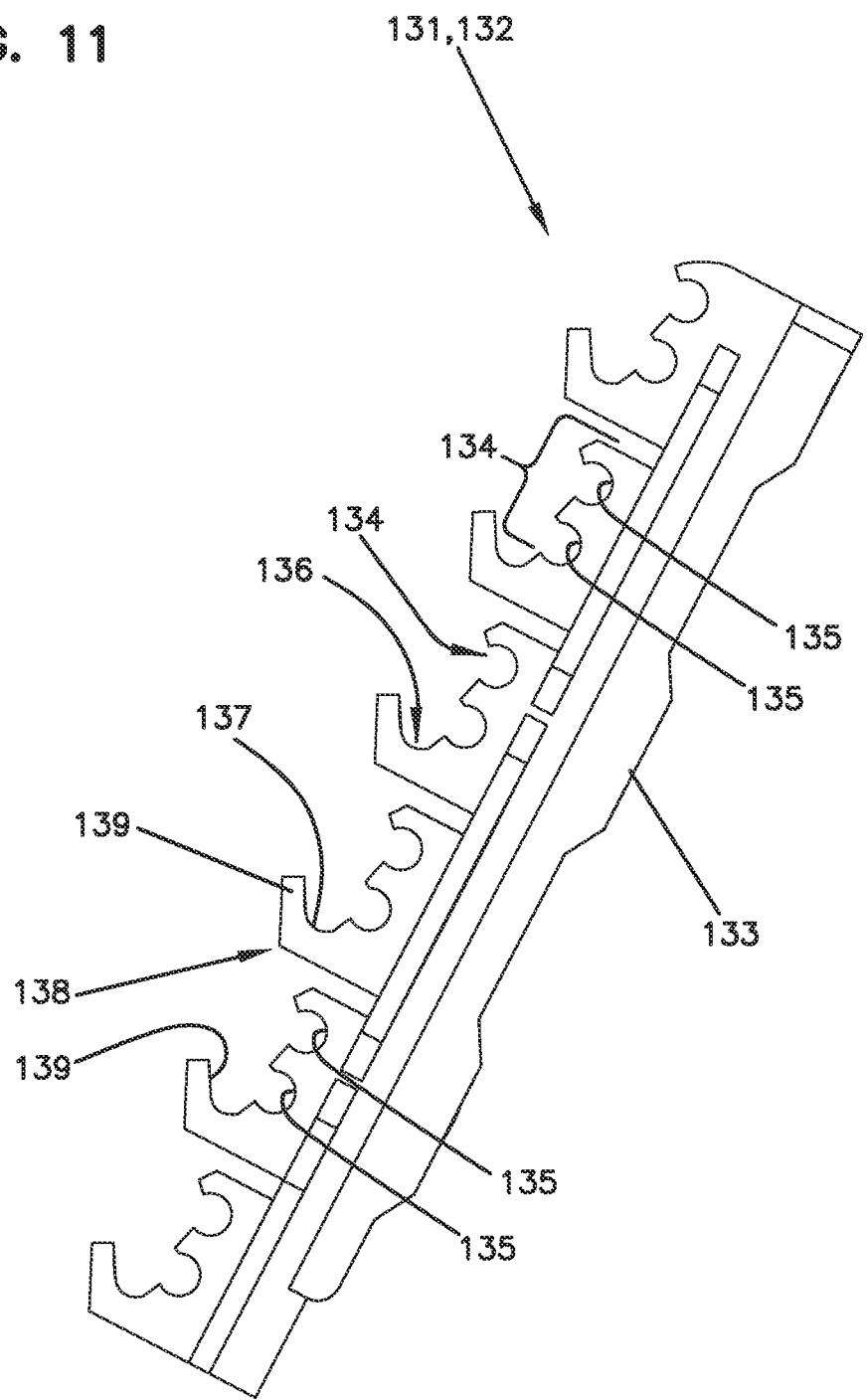
FIG. 11 is a side elevational view of an example mounting member of a mounting arrangement suitable for use with the connection assembly of FIG. 2 in accordance with principles of the present disclosure.

FIG. 11 illustrates one example implementation of a mounting member 131, 132. The mounting member 131, 132 includes a base 133 that is configured to extend along the backplane 120. The base 133 is configured to couple to the backplane 120 (e.g., via fasteners, pegs, latches, heat-staking, welding, etc.). The mounting member 131, 132 includes a snap-fit region 134 at which at least a portion of a latch pin arrangement 155 of a bridge member 150 fits. For example, the snap-fit region 134 may define one or more slots 135 that are sized and shaped to receive and hold the latch pins 155a, 155b of the latch pin arrangement 155.

In some implementations, the mounting member 131, 132 also includes a hook area 138 configured to capture the latch pin arrangement 155 if the tray module 140 is accidentally disconnected from the backplane 120 (e.g., via vibrations). The hook area 138 includes a lip 139 sized and shaped to retain the at least one of the latch pins 155b at the hook area 138. In some implementations, the mounting member 131, 132 also includes a guide region 136 that defines a guide surface 137. One of the latch pins 155b of the latch pin arrangement 155 may travel along the guide surface 137 when the bridge member 150 is being coupled to the mounting arrangement 130 to align the bridge member 150 with the backplane 120.

Figure 12:
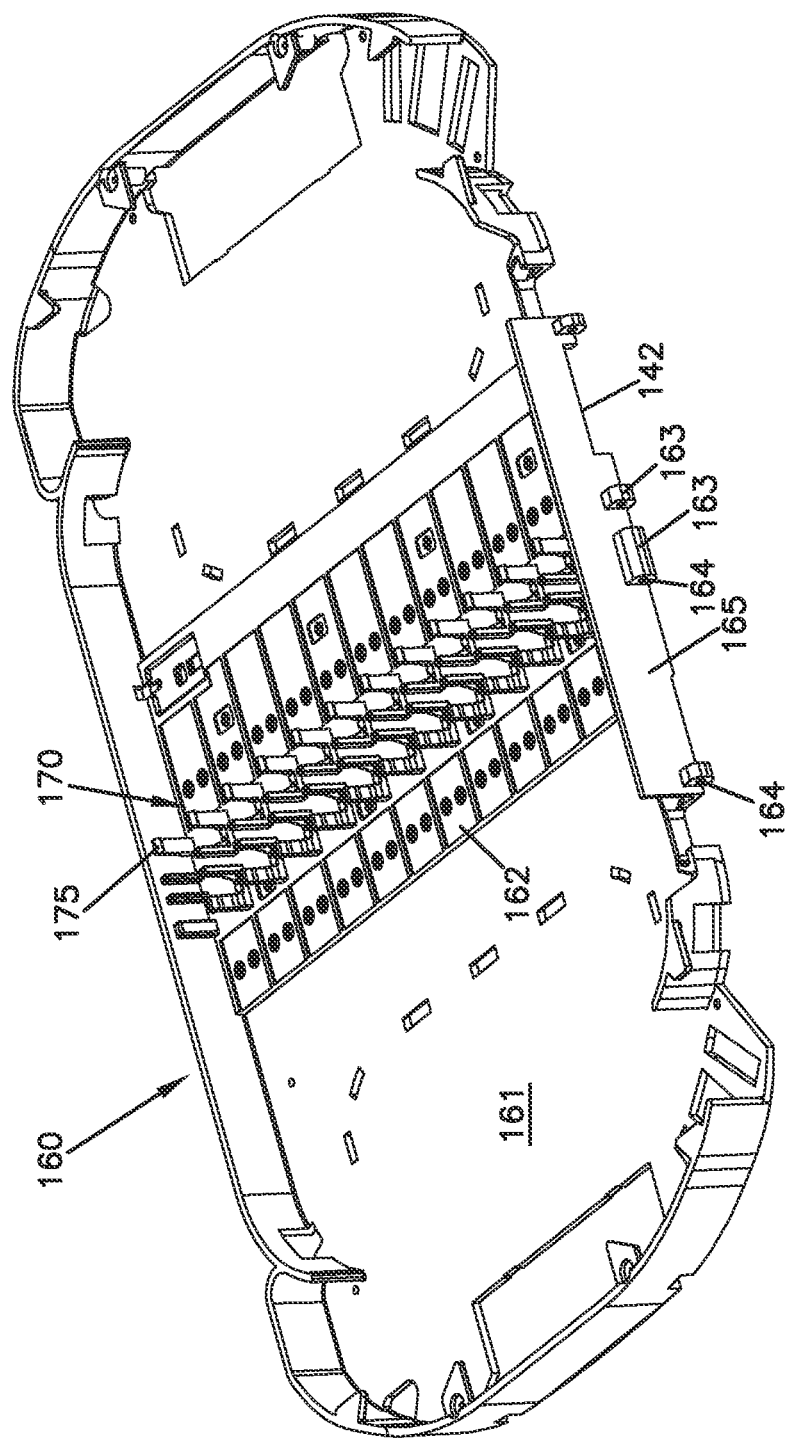
FIG. 12 is a perspective view of an example tray body suitable for use with the tray module of FIG. 6 in accordance with principles of the present disclosure.

FIG. 12 is a perspective view of an example tray body 160 suitable for connecting to the bridge member 150 of FIG. 10. The tray body 160 defines one or more bores 164 that define a pivot axis. The bores 164 are located on the tray body 160 so as to align with the bores 154 of the bridge member 150 when the tray body 160 is mounted to the bridge member 150. One or more pivot hinges 159 extends through the bores 164 of the tray body 160 and the bores 154 of the bridge member 150 to mount the tray body 160 to the bridge member 150 (e.g., see FIG. 9).

The tray body 160 is configured to pivot about the pivot hinge 159 relative to the bridge member 150 between the first position (FIG. 5) and the second position (FIG. 9). During this pivoting, the second circuit board 162 moves relative to the electrical connector 195 that is fixedly mounted to the bridge member 150. Accordingly, the flexible board 191 bends or flexes to accommodate this movement. As shown in FIG. 12, the sidewall 165 of the tray body 160 can define an aperture 142 to accommodate the bending/flexing of the flexible board 191.

In certain implementations, the bridge member body 151 is shaped to accommodate movement of the tray body 160 between the first and second positions. For example, the bridge member body 151 may define an angled surface 156 (FIG. 10) that accommodates the tray body 160 when the tray body 160 is disposed in the second position (e.g., see FIG. 9). For example, the angled surface 156 can accommodate a sidewall 165 of the tray body 160 when the tray body 160 is disposed in the second position relative to the bridge member 150.

As shown in FIGS. 5 and 12, an example tray body 160 includes a base 161 and a sidewall 165 that extends along at least a portion of a circumference of the base 161 to define an open top of the tray body 160. In certain implementations, the bores 164 of the tray body 160 are defined by support structures 163 disposed on the sidewall 165 (FIG. 12). The second circuit board 162 is mounted to the base 161 of the tray body 160. In various implementations, the second circuit board 162 can be hot stamped, friction welded, sonic welded, friction-fit, latched, or otherwise coupled to the tray body 160.

In some implementations, the second circuit board 162 mounts to a bottom of the base 161 (e.g., see FIG. 6) and portions of the second circuit board 162 are accessible from a top of the tray body 160. In other implementations, the second circuit board 162 is mounted to the top of the base 161. In certain implementations, the second circuit board 162 is disposed in a recessed surface defined in the base 161. In certain implementations, a protective cover can be disposed over the second circuit board 162. In an example, the cover is transparent.

Various optical fiber management components can be disposed on the tray body 160. For example, the tray body 160 can include a termination region, a splice region, a splitter region, and/or a fiber storage region. In the example shown in FIG. 6, the tray body 160 includes a storage region 169 at which one or more fiber spools and/or bend radius limiters are located. In certain implementations, each tray body 160 in a connection assembly 100 is commonly configured with the same components. In other implementations, however, each tray body 160 can include different components from the other tray bodies 160 in the connection assembly 100.

Figure 4:
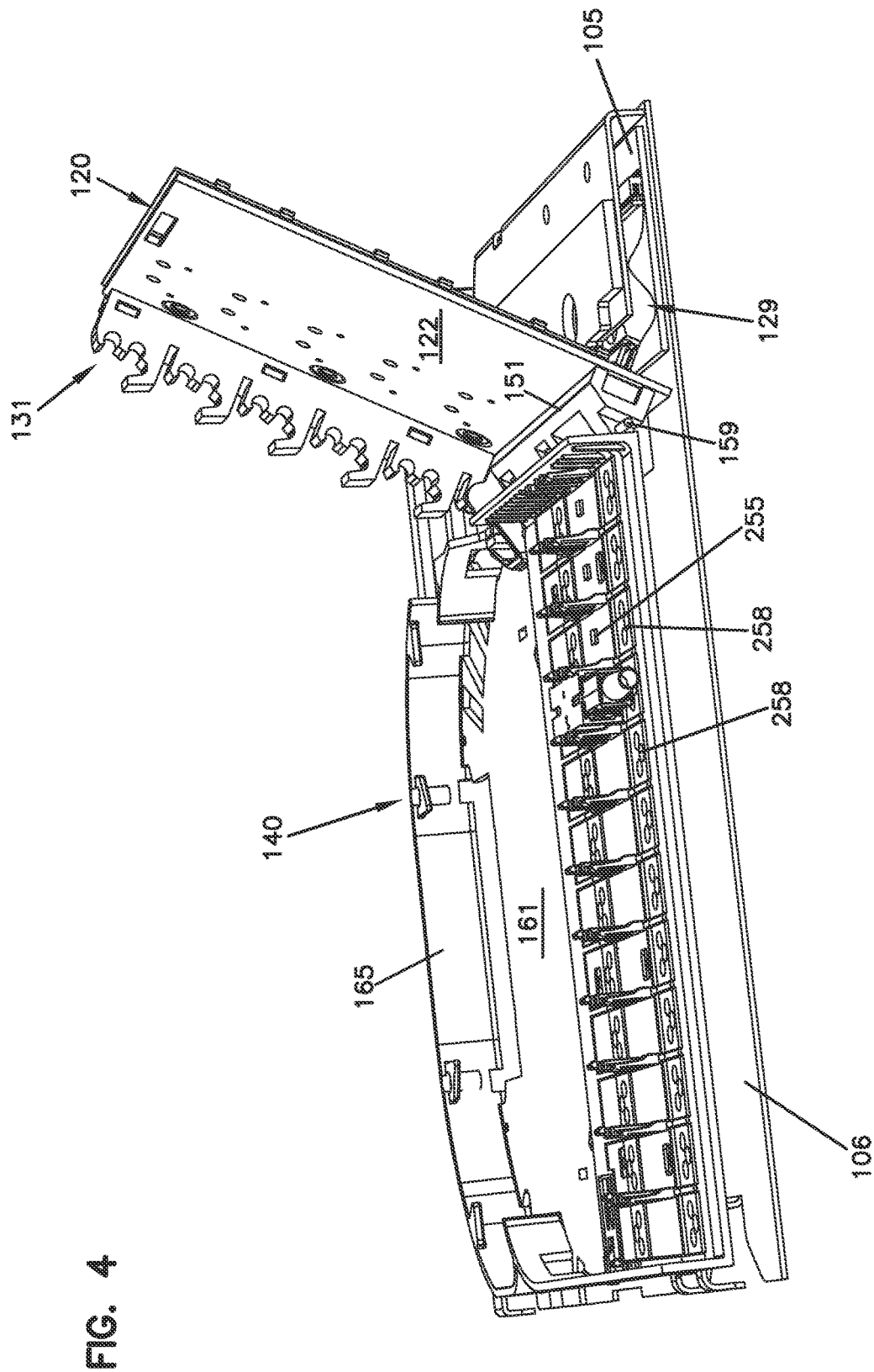
FIG. 4 is a perspective view of a cross-section of the connection assembly of FIG. 3 so that a flexible circuit arrangement between a backplane and a base circuit board is visible.

Managed connectivity components (e.g., media reading interfaces such as RFID tags or electrical contacts; light indicators; RFID readers, etc.) 250 are disposed on the second circuit board 162 and connected to the electrical connector 195 via the flexible circuit arrangement 190 (FIG. 7). For example, the managed connectivity components can be disposed at ports of optical adapters 200 disposed on the second circuit board 162. In certain examples, a light indicator may be disposed at each adapter port. In some implementations, a media reading interface may be disposed at each adapter port (e.g., see FIG. 4). In other examples, a media reading interface and a light indicator may be disposed at every second adapter port (e.g., see FIG. 13).

In some implementations, an adapter holder arrangement 170 is disposed on the base 161 of the tray body 160 to receive one or more optical adapters 200. In certain implementations, the adapter holder arrangement 170 is configured to retain the optical adapters 200 when the optical adapters 200 are pushed onto the adapter holder arrangement 170. In certain implementations, the adapter holder arrangement 170 is configured to releasably hold the optical adapters 200. In some implementations, the adapter holder arrangement 170 is coupled to the second circuit board 162. In other implementations, the adapter holder arrangement 170 is coupled to the base 161.

Each optical adapter 200 defines at least a first port 202 and a second port 204 aligned with the first port 202. In certain implementations, the optical adapter 200 is a simplex optical adapter including only these two ports 202, 204. In other implementations, the optical adapter 200 can be a duplex optical adapter, which includes two first ports 202 and two second ports 204, a quadruplex adapter, which includes four first ports 202 and four second ports 204, or another type of optical adapter 200. Each optical adapter 200 includes side flanges 205 that extend outwardly from the optical adapter 200 intermediate the ports 202, 204.

The adapter holder arrangement 170 includes latching arms 171 configured to hold at least one optical adapter 200 to the tray body 160. Distal ends of the latching arms 171 include latching hooks 172. The latching arms 171 are sufficiently flexible to enable the latching hooks 172 to flex outwardly to accommodate passage of an optical adapter 200 past the latching hooks 172 and into a space between adjacent latching arms 171. The latching hooks 172 are sufficiently resilient to snap back over the optical adapter 200 when the optical adapter 200 has past the latching hook 172.

Figure 13:
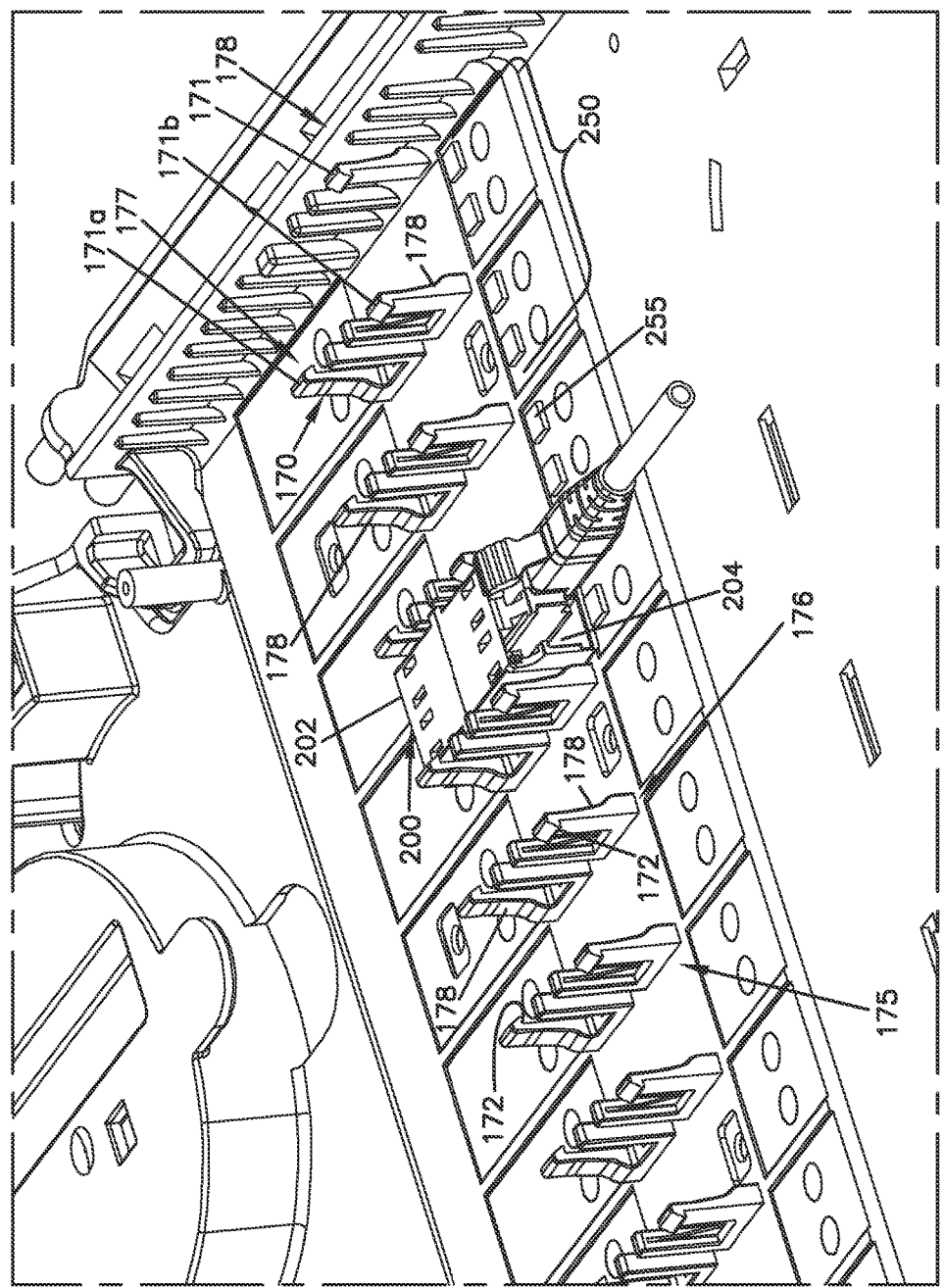
FIG. 13 is an enlarged view of the tray body of FIG. 12 to increase visibility of an adapter holder arrangement in accordance with principles of the present disclosure.

As shown in FIG. 13, the latching arms 171 of the adapter holder arrangement 170 are positioned in rows 176. The latching arms 171 of adjacent rows 176 cooperate to hold one of the optical adapters 200 to the tray body 160. One of the latching arms 171 in each row 176 faces in a first direction and another of the latching arms 171 in each row 176 faces in a second, opposite direction. Accordingly, the latching arms 171 do not directly oppose latching arms 171 in adjacent rows 176. This design also is easily moldable.

In certain implementations, the latching arms 171 define regions of reduced thickness 177 that facilitate flexing of the latching arms 171 during insertion of the adapters 200. The region of reduced thickness 177 provide a space into which the latching arms 171 can flex without contacting an adapter 200 already mounted in an adjacent row 176. Such a design enables the adapters 200 to be mounted in closely-spaced rows 176, thereby enhancing the connection density of the tray module 140.

Each row 176 also includes two support arms 173 that cooperate to hold one of the side flanges 205 of the optical adapter 200. The support arms 173 in adjacent rows 176 cooperate to hold the side flanges 205 of an optical adapter 200 to inhibit translation of the optical adapter 200 on the tray body 160. In certain implementations, the same pair of support arms 173 cooperate to hold a side flange 205 of a first optical adapter 200 at a first row 176 and a side flange 205 of a second optical adapter 200 at a second, adjacent row 176. In an example, each support arm 173 is about twice as thick as one of the side flanges 205.

Figure 14:
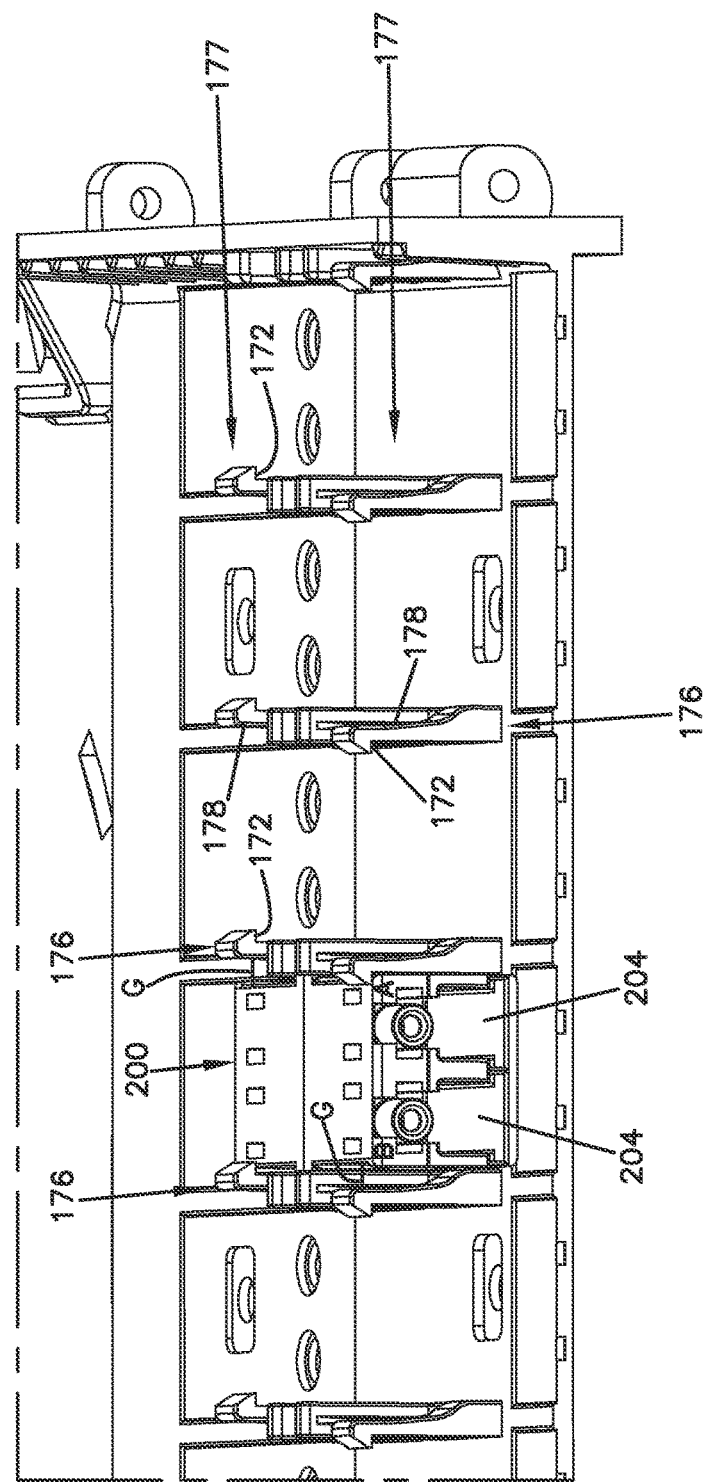
FIG. 14 is another enlarged view of the tray body of FIG. 12.

As shown in FIGS. 13 and 14, the adapter holder arrangement 170 includes two or more latching arms 171. In some implementations, two latching members 175 are disposed in each row 176 with the two support arms 173 disposed adjacent each other. The latching arm 171 of a first of the two latching members 175 of each row 176 faces in a first direction and the latching arm 171 of a second of the two latching members 175 of each row 176 faces in a second, opposite direction. As shown in FIGS. 12 and 13, a latching member 175 is provided at the sidewall 165 of the tray body 160 at either end of the adapter holder arrangement 170 to cooperate with the first and last rows 176 to hold adapters 200.

In some implementations, the latching arms 171 are disposed in columns 177. For example, the latching arms 171 can be disposed in two columns 177. In certain implementations, the latching arms 171 of a first column 177 face in a first direction and the latching arms 171 of a second column 177 face in an opposite second direction. In certain implementations, the first column 177 is axially staggered relative to the second column 177 so that a first sequential latching arm 171a in the first column 177 laterally aligns with a second sequential latching arm 171b in the second column 177. The penultimate sequential latching arm 171 in the first column laterally aligns with the last sequential latching arm 171 in the second column. The first sequential latching arm 171 in the second column 177 and the last sequential latching arm 171 in the first column 177 are disposed at the sidewall 165 of the tray 160.

In some implementations, the adapter holder arrangement 170 includes two or more latching members 175, which each include one or more the latching arms 171. In the example shown, each latching member 175 includes a single latching arm 171. In other implementations, however, each latching member 175 can include multiple latching arms 171. Each latching member 175 also includes one of the support arms 173. In certain examples, two latching members 175 are laterally aligned within each row 176. In certain examples, multiple latching members 175 are axially aligned within each column 177. In certain examples, the latching members 175 are identically formed. In certain examples, the latching members 175 of a first column 177 are oriented in a first direction and the latching members 175 of a second column 177 are oriented in a second direction.

As shown in FIG. 14, each latching arm 171 has a latching hook 172 extending from a first side of the latching arm 171. In a row of latching arms 171, the latching hook 172 of a first latching arm 171 snaps over a top of an optical adapter 200 held by the first latching arm 171. The latching hook 172 of a second latching arm 171 faces away from the optical adapter 200.

In certain examples, each latching arm 171 includes a region of reduced thickness 178 at a second side of the latching arm 171. The reduced thickness of the region 178 provides a gap G (FIG. 14) between the second latching arm 171 and optical adapter 200. This gap G enables flexing of the second latching arm 171 (and hence movement of the latching hook 172) towards the optical adapter 200. Flexing the second latching arm 171 towards the optical adapter 200 enables movement of the corresponding latching hook 172 away from a second optical adapter held by the second latching arm 171.

Each optical adapter 200 mounted to the tray body 160 by the adapter holder arrangement 170 is configured to receive two or more optical connectors 210 (e.g., LC connectors, SC connectors, MPO connectors, LX.5 connectors, etc.) at the ports 202, 204.

The managed connectivity components (e.g., media reading interfaces such as RFID tags, RFID readers, electrical contacts, etc.) 250 are disposed on the second circuit board 162. In certain implementations, media reading interfaces 255 are disposed on the second circuit board 162 at one or more of the ports 202, 204. For example, the media reading interfaces 255 can be disposed outside of the ports 202, 204 to align with portions of optical connectors 210 received at the ports 202, 204 (e.g., see FIG. 7). In other implementations, the media reading interfaces 255 can be disposed inside the ports 202, 204. In an example, each port 202, 204 is associated with a media reading interface 255. In another example, alternate ports 202, 204 are associated with media reading interfaces 255. In still other examples, only the first ports 202 or only the second ports 204 are associated with media reading interfaces 255.

In some implementations, the optical connectors 210 have indication regions of light transmissible material that glow or otherwise emit light when a light is directed on the indication region. In such implementations, the managed connectivity components include one or more light sources (e.g., LEDs) 258 disposed on the second circuit board 162 in alignment with the ports 202, 204 of the optical adapters 200 (see FIG. 4). The light sources 258 connect to the data management network via the flexible circuit arrangements 190, 129. The indication regions of the connectors 210 enables a specific connector 110 to be indicated to a user by illumination (e.g., via the management network).

A connection assembly 100 can be assembled by latching the bridge member 150 of a tray module 140 to a backplane 120 of the connection assembly 100 so that the bridge member 150 is disposed at a fixed orientation relative to the backplane 120; and connecting the circuit board connector 195 of the bridge member 150 with the first circuit board 122 of the backplane 120 (e.g., by touching the contact members 197 of the connector 195 to contact pads on the circuit board 122). The tray body 160 can be pivoted relative to the bridge member 150 to facilitate access to the tray body 160 or a tray body 160 beneath it after the tray module 140 is mounted. The flexible circuit arrangement 190 maintains a connection between the first circuit board 122 of the backplane 120 and the second circuit board 162 of the tray body 160 while the tray body 160 is pivoting relative to the backplane 120.

The bridge member 150 of the tray module 140 is latched to the backplane 120 by sliding the latch pin arrangement(s) 155 of the bridge member 150 into slots 135 defined by a mounting arrangement 130 disposed on the backplane 120. In certain implementations, the slots 135 and guide surfaces 137 of the mounting arrangement 130 are configured to align the bridge member 150 with the backplane 120 so that the electrical connector 195 aligns with the contact pads or corresponding connector of the backplane 120. Accordingly, latching the bridge member 150 at the mounting arrangement 130 automatically connects the electrical connector 195 to the first circuit board 122 of the backplane 120.

A tray module 140 can be assembled by inserting a pivot pin 159 through bores 154, 164 defined in a bridge member 150 and a tray body 160, respectively. In an example, two pivot pins 159 can be inserted coaxially from opposite sides of the tray module 140. One or more optical adapters 200 can be mounted to the tray body 160 by snap-fitting the optical adapter 200 into an adapter holder arrangement 170 disposed on the tray body 160. For example, each optical adapter 200 can be pressed between rows 176 of latching members 175 until latching hooks 172 of latching arms 171 snap over the optical adapter 200. In certain implementations, the adapter holder arrangement 170 aligns a port 202, 204 of the optical adapter 200 with a media reading interface 255 so that PLI can be read from an optical fiber (or an optical fiber connector 210) plugged into the port 202, 204.

In use, optical fibers can be connected at the connection assembly 100 while monitoring PLI associated with the optical fibers or components associated therewith. For example, one of the tray modules 140 is selected to be accessed. The trays 160 of one or more tray modules 140 are pivoted relative to the backplane 120 to provide access to the selected tray module 140. In an example, the tray 160 of the selected tray module 140 is not itself pivoted. Rather, the trays 160 of adjacent modules 140 are pivoted to provide access to the selected tray 160. The bridge members 150 of the pivoted tray modules 140 remain stationary relative to the backplane 120.

Pivoting the trays 160 does not disconnect the respective second circuit boards 162 from the first circuit board 122 of the backplane 120. Accordingly, PLI associated with optical connectors 210 disposed at the trays 160 can be monitored by reading the PLI using associated media reading interface 255 disposed on the trays 160. The PLI is communicated from the media reading interface 255 to a data management network via the second circuit board 162, the flexible circuit arrangement 190, the backplane 120. In certain implementations, the PLI also can be communicated over a flexible circuit board 129 and a base circuit board 105 that is coupled to the backplane circuit board 122. The PLI can be monitored even while the trays 160 are being pivoted relative to the backplane 120.

Upon accessing a selected tray 160, in certain implementations, one or more optical connectors 210 can be plugged into ports 202, 204 of the optical adapters 200 disposed on the selected tray 160. In certain implementations, one or more optical adapters 200 can be added to or removed from the selected tray 160. PLI associated with the optical connectors 210 (or optical fibers terminated thereby) can be monitored using corresponding media reading interfaces 255 disposed on the selected tray 160.

In certain implementations, the selected tray 160 can be removed from the connection assembly 100. For example, the bridge member 150 coupled to the selected tray 160 can be pulled out of the mounting arrangement 130, thereby disconnecting the latch pin arrangement 155 of the bridge member 150 from the mounting arrangement 130 and disconnecting the second electrical connector 195 from the first circuit board 122 (e.g., from contact pads thereat) at the backplane 120. Accordingly, removing the selected tray 160 disconnects the media reading interfaces 255 disposed thereon from the data management network.

The above specification, examples and data provide a complete sealing and retention arrangement description of the manufacture and use of the composition of the invention. Since many embodiments of the invention can be made without departing from the spirit and scope of the invention, the invention resides in the claims hereinafter appended.

LIST OF REFERENCE NUMERALS AND CORRESPONDING FEATURES 100 connection assembly
103 front opening
104 enclosure
105 base circuit board
106 shelf
108 front panel
110 base structure
120 backplane
122 first circuit board
129 flex circuit
130 mounting arrangement
131, 132 mounting member
133 base
134 snap-fit region
135 slots
136 guide region
137 guide surface
138 hook area
139 lip
140 tray module
145 pathway
150 bridge member
151 bridge member body
152 ends of the bridge member body
153 support members
154 bores
155 latch pin arrangement
155a, 155b latch pins
156 angled surface
157 slot or opening
158 mounting structures
158a stakes
158b latch arms
159 hinge pin
160 tray body
161 base
162 second circuit board
163 support members
164 bores
165 sidewall
166 channel or recess 168 contact pad region
169 storage region
170 adapter holder arrangement
171 latching arms
172 latching hooks
173 support arms
175 latching members
176 rows
177 columns
178 region of reduced thickness
190 flexible circuit arrangement
191 electrical pathway
192 first end
193 second end
194 strain bar
195 second electrical connector
200 optical adapter
202 first port
204 second port
205 side flange
210 optical connector
250 managed connectivity components
255 media reading interfaces
300 optical distribution frame
310 rack
G gap

What is claimed is:

1. A connection assembly comprising:
   a. a base structure;
   b. a backplane coupled to the base structure, the backplane including a first circuit board;
   c. a tray module configured to couple to the backplane, the tray module including:
      i. a tray body including a second circuit board and at least one managed connectivity component; and
      ii. a bridge member to which the tray body is moveably coupled so that the tray body is moveable relative to the backplane when the tray module is coupled to the backplane, the bridge member being coupled to the backplane in a fixed orientation when the tray module is coupled to the backplane so that the bridge member does not pivot relative to the backplane, and the bridge member providing a secure electrical connection between the second circuit board and the first circuit board to connect the managed connectivity component to a data management network even while the tray body is moved relative to the backplane.

2. The connection assembly of claim 1, wherein the tray body is configured to pivot relative to the bridge member.

3. The connection assembly of claim 1, further comprising a connector electrically connected to the second circuit board, the connector being configured to mate with the first circuit board to electrically connect the second circuit board to the first circuit board.

4. The connection assembly of claim 1, wherein the base structure includes a drawer.

5. The connection assembly of claim 1, wherein the base structure includes a chassis.

6. The connection assembly of claim 1, further comprising a plurality of optical adapters mounted to the tray body, each adapter defining at least one port at which the managed connectivity component is disposed.

7. The connection assembly of claim 1, wherein the tray body includes a cable storage region.

8. The connection assembly of claim 1, wherein the backplane includes a plurality of contact pads; and wherein the connection assembly further comprises a plurality of tray modules, each tray module including a connector that is configured to touch at least one of the contact pads.

9. The connection assembly of claim 1, further comprising a plurality of tray modules configured to couple to the backplane, wherein each tray module is separately removable from the backplane.

10. The connection assembly of claim 1, wherein the backplane is angled relative to the base structure.

11. The connection assembly of claim 1, further comprising an adapter holder arrangement disposed on the tray body for retaining at least one optical adapter, the adapter holder arrangement including latching arms arranged in rows and columns, wherein the latching arms in each column face in a common direction for that column.

12. The connection assembly of claim 2, wherein the tray body is configured to pivot at least about 45° relative to the backplane.

13. The connection assembly of claim 2, wherein the tray body is configured to pivot at least about 60° relative to the backplane.

14. The connection assembly of claim 3, further comprising a flexible circuit arrangement having a first end and a second end, the first end of the flexible circuit arrangement being coupled to the second circuit board, and the second end of the flexible circuit arrangement being terminated by the connector.

15. The connection assembly of claim 11, wherein each optical adapter is held by a latching arm disposed in a first row and facing in a first direction and by a latching arm disposed in a second row and facing in an opposite second direction.

16. The connection assembly of claim 14, wherein the connector does not move relative to the bridge member.

17. The connection assembly of claim 14, wherein the bridge member includes a latch pin arrangement that fit with a mounting arrangement disposed on the backplane when the tray module is coupled to the backplane; wherein the connector is configured to connect to the first circuit board when the latch pin arrangement is fitted with the mounting arrangement.

18. The connection assembly of claim 16, wherein the bridge member defines a first bore and the tray body defines a second bore that aligns with the first bore; and wherein a hinge pin extends through the first and second bores to enable the tray body to pivot relative to the bridge member.

19. The connection assembly of claim 17, wherein the latch pin arrangement is disposed at a first side of the bridge member and a second latch pin arrangement is disposed at a second side of the bridge member.

20. The connection assembly of claim 17, wherein the mounting arrangement includes a hook area configured to capture the latch pin arrangement if the tray module is accidentally disconnected from the backplane.

21. The connection assembly of claim 17, wherein each latch pin arrangement includes a pair of latch pins, and wherein the mounting arrangement defines a snap-fit region at which one of the latch pins of each pair fits and a guide region along which the other of the latch pins of each pair travels to align the bridge member with the backplane.

22. A connection assembly comprising:
   a. a base structure;
   b. a backplane coupled to the base structure, the backplane including a first circuit board;
   c. a tray module configured to couple to the backplane, the tray module including:

i. a tray body including a second circuit board and at least one managed connectivity component; and ii. a bridge member to which the tray body is moveably coupled so that the tray body is moveable relative to the backplane when the tray module is coupled to the backplane, the bridge member being configured to couple to the backplane in a fixed orientation so that the bridge member does not pivot relative to the backplane, and the bridge member providing a secure electrical connection between the second circuit board and the first circuit board to connect the managed connectivity component to a data management network even while the tray body is moved relative to the backplane;

d. a connector electrically connected to the second circuit board, the connector being configured to mate with the first circuit board to electrically connect the second circuit board to the first circuit board; and e. a flexible circuit arrangement having a first end and a second end, the first end of the flexible circuit arrangement being coupled to the second circuit board, and the second end of the flexible circuit arrangement being terminated by the connector.

23. A connection assembly comprising:

a. a base structure;

b. a backplane coupled to the base structure, the backplane including a first circuit board;

c. a tray module configured to couple to the backplane, the tray module including:

i. a tray body including a second circuit board and at least one managed connectivity component; and ii. a bridge member to which the tray body is moveably coupled so that the tray body is moveable relative to the backplane when the tray module is coupled to the backplane, the bridge member being configured to couple to the backplane in a fixed orientation so that the bridge member does not pivot relative to the backplane, and the bridge member providing a secure electrical connection between the second circuit board and the first circuit board to connect the managed connectivity component to a data management network even while the tray body is moved relative to the backplane; and an adapter holder arrangement disposed on the tray body for retaining at least one optical adapter, the adapter holder arrangement including latching arms arranged in rows and columns, wherein the latching arms in each column face in a common direction for that column.

* * * * *